(12) United States Patent
Ho et al.

(10) Patent No.: US 11,522,125 B2
(45) Date of Patent: Dec. 6, 2022

(54) SEMICONDUCTOR STACK FOR HALL EFFECT DEVICE

(71) Applicant: Melexis Technologies SA, Bevaix (CH)

(72) Inventors: Kuan-Ting Ho, Reutlingen (DE); Lucian Barbut, Renens (CH)

(73) Assignee: MELEXIS TECHNOLOGIES SA, Bevaix (CH)

( * ) Notice: Subject to any disclaimer, the term of this patent is extended or adjusted under 35 U.S.C. 154(b) by 12 days.

(21) Appl. No.: 17/172,663

(22) Filed: Feb. 10, 2021

(65) Prior Publication Data

US 2021/0257544 A1 Aug. 19, 2021

(30) Foreign Application Priority Data

Feb. 14, 2020 (EP) ..................... 20157321

(51) Int. Cl.
*H01L 43/06* (2006.01)
*H01L 43/14* (2006.01)
*H01L 43/04* (2006.01)

(52) U.S. Cl.
CPC ............ *H01L 43/065* (2013.01); *H01L 43/04* (2013.01); *H01L 43/14* (2013.01)

(58) Field of Classification Search
CPC .... H01L 43/065; H01L 43/14; H01L 29/7725
See application file for complete search history.

(56) References Cited

U.S. PATENT DOCUMENTS 5,442,221 A * 8/1995 Mosser ................. H01L 43/065
257/14

OTHER PUBLICATIONS

Mosser et al., "Low-Frequency Noise in AlGaAs/InGaAs/GaAs Hall Micromagnetometers," Proceedings of SPIE 5115, Noise and Information in Nanoelectronics, Sensors, and Standards, May 8, 2003, 14 Pages.
Pross et al., "Second-Generation Quantum-Well Sensors for Room-Temperature Scanning Hall Probe Microscopy," Journal of Applied Physics, vol. 97, Issue 096105, Apr. 20, 2005, 4 Pages.
Kunets et al., "Generation-Recombination Noise in Pseudomorphic Modulation-Doped Al0.2Ga0.8/In0.1Ga0.9,As/GaAs Micro-Hall Devices," IEEE Sensors Journal, vol. 5, No. 5, Oct. 31, 2005.
Schaier et al., Sensitivity Enhancement of AlGaAs/InGaAs/GaAs Quantum Well-Based Hall Device, Journal of Applied Physics, vol. 100, Issue 044316, Aug. 25, 2006.
Search Report from corresponding European Application No. EP20157321, dated Aug. 4, 2020.

* cited by examiner

*Primary Examiner* — Latanya N Crawford Eason
(74) *Attorney, Agent, or Firm* — Workman Nydegger

(57) ABSTRACT

A semiconductor stack for a Hall effect device, which comprises: a bottom barrier comprising $Al_xGa_{1-x}As$, a channel comprising $In_yGa_{1-y}As$, on the bottom barrier, a channel barrier with a thickness which is at least 2 nm and which is smaller than or equal to 15 nm, and which at least comprises a first layer comprising $Al_zGa_{1-z}As$ with $0.1 \leq z \leq 0.22$, wherein the first layer has a thickness of at least 2 nm, wherein a conduction band edge of the bottom barrier and the first layer is higher than a conduction band edge of the channel, a doping layer comprising a composition of Al, Ga and As and doped with n-type material, a top barrier comprising a composition of Al, Ga and As.

13 Claims, 3 Drawing Sheets

SEMICONDUCTOR STACK FOR HALL EFFECT DEVICE

FIELD OF THE INVENTION

The invention relates to the field of semiconductor stacks. More specifically it relates to semiconductor stacks for Hall devices.

BACKGROUND OF THE INVENTION

A typical III-V epi stack utilized as Hall sensing element in the prior art comprises a channel between a barrier region and a bottom barrier. The barrier region and bottom barrier are materials with higher conduction band edge, and the channel is material with lower conduction band edge, forming a quantum well. The electron is confined in the channel layer creating a 2-dimension electron gas with high electron mobility. The doping layer is usually referred as delta-doping.

Achieving both high sheet resistance, and low low-frequency (LF) noise in a III-V epi stack has long been the target of substrates to be used for Hall-effect applications. On one hand, high sheet resistance gives higher voltage-related magnetic sensitivity and lower current consumption. Therefore, a low enough electron concentration in the epi stack is desired to increase the sheet resistance. On the other hand, lower LF noise reduces the corner frequency, and increases the signal-noise ratio.

Both 1/f noise and Generation-Combination (G-R) noise contribute to the LF noise.

In terms of generating less 1/f noise, better electron confinement in the channel layer, possessing higher mobility and less impurities, is desired. In other words, the more electrons are concentrated in the channel layer w.r.t. the whole epi stack, the better the electron confinement is.

In terms of generating less G-R noise, two G-R noise sources have been identified, that is, the electron trap states and the thermally activated real-space-electron-transfer. For electron trap states, these trap states capture electrons and create fluctuation in electron concentration, generating G-R noise. In a typical AlGaAs (barrier)/InGaAs (channel)/GaAs (substrate) epi stack system, the "DX-center" electron trap states are generated in AlGaAs due to the doping in the barrier region. For thermally activated real-space-electron-transfer, the electron transfer between the barrier region and the channel when gaining enough energy, creates fluctuation in electron concentration. This transfer is correlated with the conduction band offset between barrier region and channel. The G-R noise intensity from real-space-electron-transfer in the 100 kHz to 1 MHz decreases as the characteristic time increases, i.e., the conduction band offset between barrier region and channel increases.

However, decreasing the Al composition in AlGaAs in the barrier region preventing the DX-centers lowers the conduction band edge, which reduces the conduction band offset between spacer and channel, causing greater thermally activated real-space-electron-transfer.

There is therefore a need for a semiconductor stack for a Hall effect device with high sheet resistance, low 1/f noise, and low G-R noise.

SUMMARY OF THE INVENTION

It is an object of embodiments of the present invention to provide a good semiconductor stack for a Hall device.

The above objective is accomplished by a method and device according to the present invention.

Embodiments of the present invention relate to a semiconductor stack for a Hall effect device. The semiconductor stack comprises:
- a bottom barrier comprising $Al_xGa_{1-x}As$ (with x between 0 and 1, different from 0 and different from 1),
- a channel comprising $In_yGa_{1-y}As$ on the bottom barrier (with y between 0 and 1, different from 0 and different from 1),
- a channel barrier with a thickness which is at least 2 nm and which is smaller than or equal to 15 nm, and which at least comprises a first layer comprising $Al_zGa_{1-z}As$ with $0.1 \leq z \leq 0.22$, wherein the first layer has a thickness of at least 2 nm, wherein a conduction band edge of the bottom barrier and the first layer is higher than a conduction band edge of the channel,
- a doping layer comprising a composition of Al, Ga and As and doped with n-type material,
- a top barrier comprising a composition of Al, Ga and As.

It is an advantage of embodiments of the present invention that a quantum well is formed by sandwiching the channel layer consisting of low conduction band edge materials between the barrier region and the bottom barrier consisting of high conduction band edge materials. Electrons are thereby confined in the channel layer creating 2-dimensional electron gas with high electron mobility.

It is an advantage of embodiments of the present invention that the channel barrier comprises a first layer which comprises $Al_zGa_{1-z}As$ with $0.1 \leq z \leq 0.22$. If z would be larger than 0.22 this would result in an increased noise level of the Hall effect device. If z would be smaller than 0.1 this would result in reduced energy offset between the channel barrier and the channel. It is found by the inventors that if z is outside the specified range this will affect the device performance. This also is the case for the thickness of the channel barrier which should at least be 2 nm and which should be smaller than or equal to 15 nm. It is found by the inventors that if this is not the case this will result in an increased parallel conduction in the barrier region which will lead to a higher electron concentration in this region.

In embodiments of the present invention a concentration of Indium in the channel is such that $0.01 \leq y \leq 0.2$, and the channel has a thickness which is between 10 and 20 nm. In some embodiments of the present invention y may even satisfy the following condition: $0.01 \leq y \leq 0.12$. In some embodiments of the present invention the thickness may even be between 12 nm and 16 nm.

It is an advantage of embodiments of the present invention that the lattice mismatch between the channel and the barrier is limited by the upper limits of the In concentration and the thickness of the channel. It is an advantage of embodiments of the present invention that parallel conduction in the barrier regions is limited by the lower limits of the In concentration and the thickness of the channel.

In embodiments of the present invention a concentration of Aluminum in the bottom barrier is such that $0.1 \leq x \leq 0.4$. In some embodiments of the present invention x may even satisfy the following condition: $0.1 \leq x \leq 0.3$.

In embodiments of the present invention the channel barrier comprises a second layer between the first layer and the channel. The second layer comprises $Al_vGa_{1-v}As$ with $0.2 \leq v \leq 0.6$ and with a thickness which is at least 2 nm and which is smaller than or equal to 6 nm, and the second layer has a higher conduction band edge than the first layer.

It is an advantage of embodiments of the present invention that electron trap states generation is avoided. It is, moreover, an advantage that electron concentration in the barrier region can be reduced. It is advantageous that a conduction band offset between the first layer and the channel can be maintained. It is also an advantage that the electron concentration in the channel can be reduced.

Preferably the first layer has a thickness of at least 4 nm to avoid dopant atoms in the doping layer to enter in the high Al-content region of the second layer.

In embodiments of the present invention $0.2 \leq v \leq 0.4$.

In embodiments of the present invention v may be such that $0.2 \leq v \leq 0.4$ or even such that $0.25 \leq v \leq 0.35$.

In embodiments of the present invention the doping concentration of the n-type material in the doping layer is between $10 \times 10^{11}$ cm$^{-2}$ and $0.8 \times 10^{12}$ cm$^{-2}$.

In embodiments of the present invention the doping layer has a thickness below 5 nm and above 1 nm.

In embodiments of the present invention the Al, Ga, As composition of the doping layer is such that for $Al_wGa_{1-w}As$, $0.1 \leq w \leq 0.22$.

In embodiments of the present invention the thickness of the top barrier is between 40 nm and 2 μm.

In embodiments of the present invention the Al, Ga, As composition of the top barrier is such that for $Al_tGa_{1-t}As$, $0.1 \leq t \leq 0.3$.

In embodiments of the present invention the bottom barrier has a thickness between 40 nm and 500 nm.

In embodiments of the present invention an n-doped cap layer is present on the top barrier.

In embodiments of the present invention the bottom barrier is present on a substrate or on a buffer layer on the substrate.

Embodiments of the present invention also relate to a Hall effect device comprising a semiconductor stack according to embodiments of the present invention wherein ohmic contacts are provided on the top barrier.

Particular and preferred aspects of the invention are set out in the accompanying independent and dependent claims. Features from the dependent claims may be combined with features of the independent claims and with features of other dependent claims as appropriate and not merely as explicitly set out in the claims.

These and other aspects of the invention will be apparent from and elucidated with reference to the embodiment(s) described hereinafter.

Figure 1:
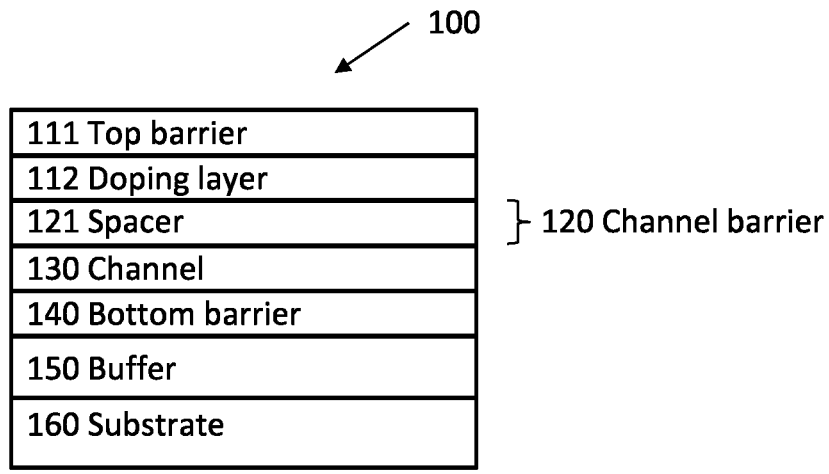
FIG. 1 shows a schematic drawing of a semiconductor stack for a Hall device in accordance with embodiments of the present invention.

Any reference signs in the claims shall not be construed as limiting the scope.

In the different drawings, the same reference signs refer to the same or analogous elements.

DETAILED DESCRIPTION OF ILLUSTRATIVE EMBODIMENTS

The present invention will be described with respect to particular embodiments and with reference to certain drawings but the invention is not limited thereto but only by the claims. The drawings described are only schematic and are non-limiting. In the drawings, the size of some of the elements may be exaggerated and not drawn on scale for illustrative purposes. The dimensions and the relative dimensions do not correspond to actual reductions to practice of the invention.

The terms first, second and the like in the description and in the claims, are used for distinguishing between similar elements and not necessarily for describing a sequence, either temporally, spatially, in ranking or in any other manner. It is to be understood that the terms so used are interchangeable under appropriate circumstances and that the embodiments of the invention described herein are capable of operation in other sequences than described or illustrated herein.

Moreover, the terms top, under and the like in the description and the claims are used for descriptive purposes and not necessarily for describing relative positions. It is to be understood that the terms so used are interchangeable under appropriate circumstances and that the embodiments of the invention described herein are capable of operation in other orientations than described or illustrated herein.

It is to be noticed that the term "comprising", used in the claims, should not be interpreted as being restricted to the means listed thereafter; it does not exclude other elements or steps. It is thus to be interpreted as specifying the presence of the stated features, integers, steps or components as referred to, but does not preclude the presence or addition of one or more other features, integers, steps or components, or groups thereof. Thus, the scope of the expression "a device comprising means A and B" should not be limited to devices consisting only of components A and B. It means that with respect to the present invention, the only relevant components of the device are A and B.

Reference throughout this specification to "one embodiment" or "an embodiment" means that a particular feature, structure or characteristic described in connection with the embodiment is included in at least one embodiment of the present invention. Thus, appearances of the phrases "in one embodiment" or "in an embodiment" in various places throughout this specification are not necessarily all referring to the same embodiment, but may. Furthermore, the particular features, structures or characteristics may be combined in any suitable manner, as would be apparent to one of ordinary skill in the art from this disclosure, in one or more embodiments.

Similarly it should be appreciated that in the description of exemplary embodiments of the invention, various features of the invention are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims following the detailed description are hereby expressly incorporated into this detailed description, with each claim standing on its own as a separate embodiment of this invention.

Furthermore, while some embodiments described herein include some but not other features included in other embodiments, combinations of features of different embodiments are meant to be within the scope of the invention, and form different embodiments, as would be understood by those in the art. For example, in the following claims, any of the claimed embodiments can be used in any combination.

In the description provided herein, numerous specific details are set forth. However, it is understood that embodiments of the invention may be practiced without these specific details. In other instances, well-known methods, structures and techniques have not been shown in detail in order not to obscure an understanding of this description.

Embodiments of the present invention relate to a semiconductor stack 100 for a Hall effect device.

The semiconductor stack 100 comprises:
- a bottom barrier 140 comprising $Al_xGa_{1-x}As$,
- a channel 130 comprising $In_yGa_{1-y}As$, on the bottom barrier 140, a channel barrier 120 with a thickness which is at least 2 nm and which is smaller than or equal to 15 nm, and which at least comprises a first layer 121 comprising $Al_zGa_{1-z}As$ with $0.1 \leq z \leq 0.22$, wherein the first layer 121 has a thickness of at least 2 nm, wherein a conduction band edge of the bottom barrier 140 and the first layer 121 is higher than a conduction band edge of the channel 130,
- a doping layer 112 comprising a composition of Al, Ga and As and doped with n-type material,
- a top barrier 111 comprising a composition of Al, Ga and As.

Figure 2:
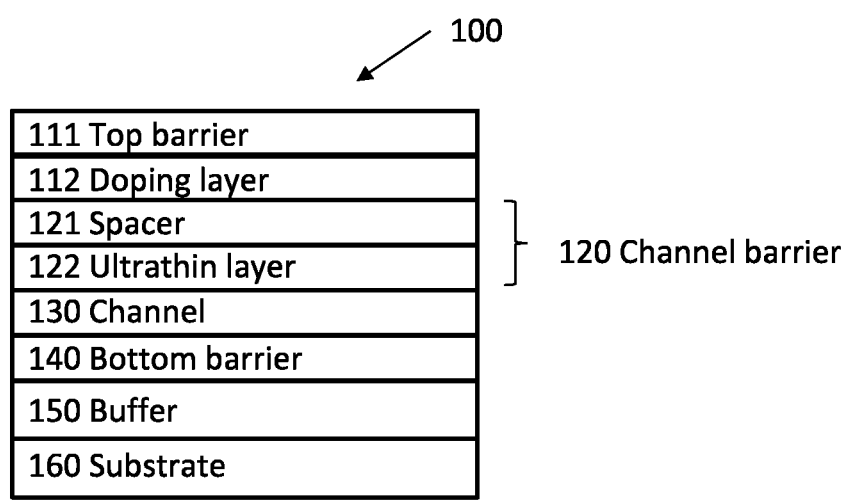
FIG. 2 shows a schematic drawing of a semiconductor stack for a Hall device comprising an ultrathin layer in accordance with embodiments of the present invention.

Examples of such stacks are schematically drawn in FIG. 1 and FIG. 2. They are particularly advantageous because they result in a combination of a high sheet resistivity and a high mobility. Both stacks are comprising a channel barrier 120. This channel barrier 120 comprises a first layer 121 also referred to as the spacer. The channel barrier 120 may also comprise a second layer 122 also referred to as the ultrathin layer.

Silicon Hall plates have a typical sensitivity of 1300 $cm^2/Vs$. GaAs epi stack Hall plates can have a mobility up to 8000 $cm^2/Vs$, thereby increasing the Hall effect sensitivity. However, typical sheet resistance of Si Hall plates is 4000 ohm/square, while the sheet resistance of a GaAs epi stack (prior-art) is only about 1000-1200 ohm/square. In the present invention, the epi stack design allows to increase the sheet resistance (to 2000 to 4000 ohm/square) while keeping a same high-mobility and low-noise properties.

In embodiments of the present invention an increased sheet resistance is achieved by lowering the electron concentration in the channel.

Low-frequency noise has a 1/f-like spectrum, characterized by a certain corner frequency. Above the corner frequency, the noise of the device consists only of thermal noise, which depends only on temperature and Hall plate resistance. Having a Hall plate with low LF noise reduces the minimum sampling (spinning) frequency of the sensor system. A typical corner frequency of the 1/f noise in a Silicon Hall plate is below 1 kHz, whereas in GaAs-based Hall plates the corner frequency is typically higher than 100 kHz.

In embodiments of the present invention a decreased 1/f noise is achieved by lowering the electron concentration in the barrier region, i.e. increase electron confinement. In embodiments of the present invention a decreased G-R noise is achieved by avoiding the generation of electron trap states e.g. DX-center. In embodiments of the present invention a decreased G-R noise is achieved by maintaining a high conduction band offset between spacer and channel to prevent thermally activated real-space-electron-transfer.

It is found by the inventors that by restraining the range of Al content and by restraining the range of the width in the channel barrier, the performance of the device in terms of signal to noise ratio can be improved. A reduced noise level can be obtained by selecting $0.1 \leq z \leq 0.22$ (or $z \leq 0.2$), and by selecting the thickness d of the channel barrier between 2 nm and 15 nm. The spacer 121 should have a thickness above 2 nm. Preferably the spacer has a thickness above 4 nm. The thickness of the spacer may for example be 8 nm.

By selecting $0.1 \leq z \leq 0.22$ (or even $z \leq 0.2$) the generation of DX-centers and G-R noise is reduced. The thickness d can be designed to achieve a desired electron concentration in the channel 130 and a low electron concentration in the barrier region (comprising the top barrier, the doping layer, and the channel barrier), in order to decrease the sheet resistance.

Figure 3:
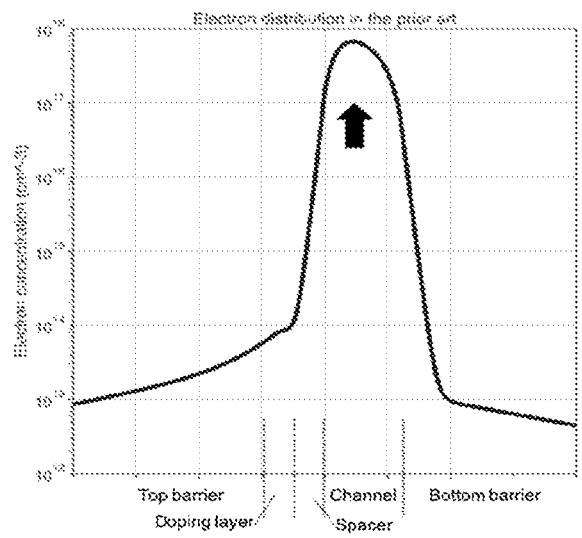
FIG. 3 shows an electron distribution of a prior art semiconductor stack for a Hall device.

This, as opposed to the prior art of which an example is given in the following paragraph. An electron distribution, obtained through simulation, of a prior art stack according to Mosser et al. is shown in FIG. 3. Mosser et al. (V. Mosser, G. Jung, J. Przybytek, M. Ocio, and Y. Haddab, "Low-frequency noise in AlGaAs/InGaAs/GaAs Hall micromagnetometers," in Noise and Information in Nanoelectronics, Sensors, and Standards, 2003, vol. 5115, pp. 183-196) has demonstrated epi stacks with a graded AlGaAs barrier region, where the Al composition is high, e.g. Al=0.4, at the bottom interface, i.e. the barrier region/channel interface, and reduced to zero at the top interface, i.e. the surface, to keep the high conduction band offset between barrier region and channel.

In this prior art, because the DX-centers are created in the barrier with an Al composition in AlGaAs which is higher than 0.22, the delta-doping layer has to be selected too close to the channel, for example 4 nm, to ensure the electron trap states are much higher than the Fermi level and to avoid the occupation of DX-centers. This measure leads to an inevitable high electron concentration in the channel (as marked with the black arrow in FIG. 3) with the risk of dopant diffusion into the channel, which reduces electron mobility. FIG. 3 demonstrates, by simulations, a resulting high electron concentration in the channel for a graded AlGaAs barrier region, which requires a short distance between the delta-doping layer and channel, for example 4 nm here.

The epitaxial stack (epi stack) according to embodiments of the present invention provides a structural approach to realize a Hall element with both high sheet resistance and low LF noise.

In embodiments of the present invention a concentration of indium in the channel 130 is such that $0.01 \leq y \leq 0.12$, and the channel 130 has a thickness which is at least 12 nm and which is smaller than or equal to 16 nm.

In embodiments of the present invention a concentration of Al in the bottom barrier 140 is such that $0.1 \leq x \leq 0.3$.

Figure 4:
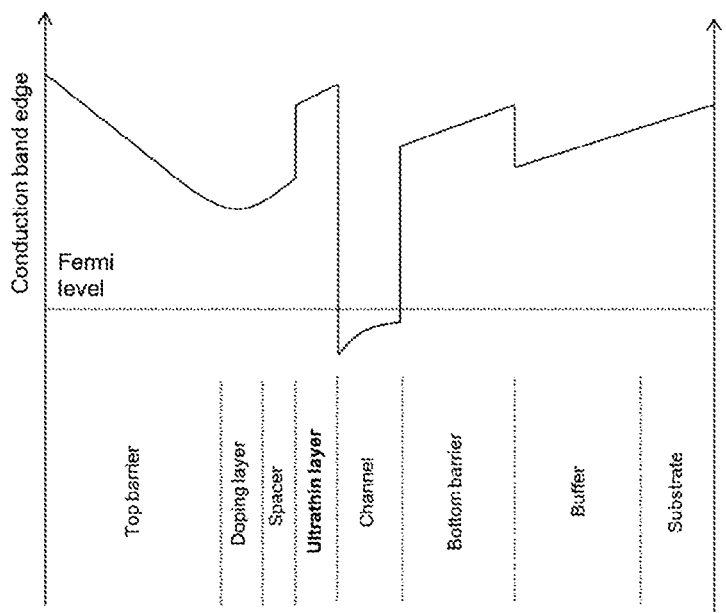
FIG. 4 shows a schematic drawing of a conduction band structure of a semiconductor stack in accordance with embodiments of the present invention.

In embodiments of the present invention the channel barrier 120 comprises a second layer 122 between the first layer 121 and the channel 130. The second layer comprises $Al_vGa_{1-v}As$ with $0.2 \leq v \leq 0.6$ and with a thickness which is at least 2 nm and which is smaller than or equal to 6 nm. The second layer 122 has a higher conduction band edge than the first layer 121. The first layer is also referred to as the spacer. The second layer is also referred to as the ultrathin layer. It has a higher conduction band edge than the first layer. A schematic structure of such an epi stack is depicted in FIG. 2, and the schematic conduction band structure is depicted in FIG. 4.

In embodiments of the present invention the design optimization may be obtained by a dedicated simulation model with a reliable Schrodinger-Poisson solver. In addition, experiments on device fabrication may be performed for the qualitative assessment of the optimization.

The Al concentration may for example be obtained by simulation optimization. Thereby the intervalley scattering near the interface of the ultrathin layer 122 and the channel 130 may be ignored, i.e., the electron confinement happens only in individual valleys separately.

The ultrathin layer 122 may consist of $Al_vGa_{1-v}As$ with wherein v has a smaller range than $0.2 \le v \le 0.6$, for example, $0.2 \le v \le 0.4$ (or even $0.25 \le v \le 0.35$) which is determined by the direct-indirect band gap transition of AlGaAs when assuming the intervalley scattering happens.

In embodiments of the present invention the ultrathin layer has a thickness which is at least 2 nm and is smaller than 6 nm. In embodiments of the present invention the thickness of the ultrathin layer may for example range between 2 and (d−4) nm, where d is the thickness of ultrathin layer plus the spacer to ensure an optimal functionality of the ultrathin layer. The said (d−4) nm is thereby determined to avoid dopant diffusion into the channel 130.

It is an advantage of embodiments of the present invention that the ultrathin layer 122 provides sufficiently large conduction band offset between the ultrathin layer 122 and the channel 130 to inhibit the real-space-electron-transfer, and therefore reduces the G-R noise.

It is an advantage of embodiments of the present invention that a better electron confinement is achieved by providing the ultrathin layer thereby reducing parallel conduction, and thus reducing the 1/f noise.

Figure 5:
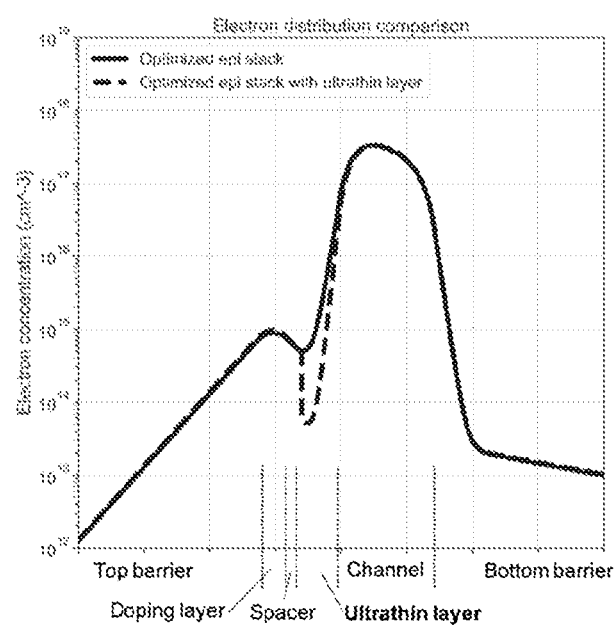
FIG. 5 shows the simulated electron distribution of a prior art epi stack and the simulated electron distribution of an epi stack in accordance with embodiments of the present invention.

The ultrathin layer 122 can be combined with any existing III-V epi stack, which has or has not been optimized for specific product requirements, to increase the noise performance of the Hall devices. For example, comparing to an optimized epi stack design which yields a low electron concentration both in the channel and the barrier, the embodiment with a 6 nm ultrathin layer 122 consisting of $Al_{0.35}Ga_{0.65}As$ increases the electron confinement with 40%. The electron concentration distribution that is demonstrated in FIG. 5 limits the parallel conduction and also the chance of real-space-electron-transfer. In FIG. 5 the fixed line represents the simulated electron distribution of an optimized epi stack without the ultrathin layer 122 and the dashed line represents the simulated electron distribution of an optimized epi stack with ultrathin layer 122 in accordance with embodiments of the present invention. The optimized epi stack targets already a low electron concentration in the channel as well as in the barrier region. It can be seen that the electron concentration in the barrier region is reduced even more by providing the ultrathin layer 122, thereby enhancing the electron confinement in the optimized epi stack. The reduced electron concentration in the barrier region results in lower noise. As can be seen from the figure the ultrathin layer does not have much effect on the electron concentration in the channel itself. In embodiments of the present invention a typical sheet resistance between 2000 and 4000 ohm/square may be obtained. That corresponds to an average electron sheet density in the channel of $0.35 \times 10^{12}$ $cm^{-2}$ to $0.18 \times 10^{12}$ cm', or an average electron concentration expressed in the same unit as in the graphs of $2.5 \times 10^{17}$ $cm^{-3}$ to $10^{17}$ $cm^3$ (for 15 nm channel thickness).

In embodiments of the present invention the top barrier 111 may for example have a thickness of more than 20 nm, for example more than 40 nm, for example around 60 nm. For a good performance of the stack it should be thick enough (mobility, carrier density). It should, on the other hand, be not too thick as this will result in a more complex processing of the ohmic contacts.

In embodiments of the present invention the doping concentration of the n-type material in the doping layer 112 may be between $10 \times 10^{11}$ $cm^2$ and $0.8 \times 10^{12}$ $cm^2$. The dopant may for example be Silicon. The invention is, however, not limited to this dopant. Any other n-type dopant for AlGaAs, known by the person skilled in the art, may be used. In embodiments of the present invention the doping layer 112 may have a thickness below 5 nm and above 1 nm, for example 3 nm. In embodiments of the present invention the Al, Ga, As composition of the doping layer is such that for $Al_wGa_{1-w}As$, $0.1 \le w \le 0.22$.

In embodiments of the present invention an n-doped cap layer is present on the top barrier 111. This doped cap layer is a top contact and ensures low contact resistance and avoids excess surface states on top of the layer underneath the cap. Thus a low noise operation can be achieved.

In embodiments of the present invention the bottom barrier 140 is present on a substrate 160 or on a buffer layer 150 on the substrate. Examples thereof are illustrated in FIG. 1 and FIG. 2. The substrate may comprise GaAs. Also the buffer layer may comprise GaAs.

Embodiments of the present invention also relate to a Hall-effect device comprising a semiconductor stack 100 in accordance with embodiments of the present invention wherein ohmic contacts are provided on the top barrier 111. The invention is advantageous for magnetic sensing applications that may require high sensitivity Hall plates. In this case, GaAs-based, Hall plates can benefit of this invention. Application examples are: current sensors, position sensors, e-compass, magnetometers, latch/switch etc.

The invention claimed is:

1. A semiconductor stack for a Hall effect device, the semiconductor stack comprising:
    a bottom barrier comprising $Al_xGa_{1-x}$;
    a channel comprising $In_yGa_{1-y}As$, on the bottom barrier;
    a channel barrier with a thickness which is at least 2 nm and which is smaller than or equal to 15 nm, and which at least comprises a first layer comprising $Al_zGa_{1-z}As$ with $0.1 \le z \le 0.22$, wherein the first layer has a thickness of at least 2 nm, wherein a conduction band edge of the bottom barrier and the first layer is higher than a conduction band edge of the channel, the channel barrier on the channel;
    a doping layer comprising a composition of Al, Ga and As and doped with an n-type dopant, the doping layer on the channel barrier;
    a top barrier comprising a composition of Al, Ga and As, on the doping layer,
    wherein the channel barrier comprises a second layer between the first layer and the channel, the second layer comprising $Al_vGa_{1-v}As$ with $0.2 \le v \le 0.6$ and with a thickness which is at least 2 nm and which is smaller than or equal to 6 nm, wherein the second layer has a higher conduction band edge than the first layer.

2. The semiconductor stack according to claim 1, wherein a concentration of In in the channel is such that $0.01 \le y \le 0.2$, and wherein the channel has a thickness which is between 10 and 20 nm.

3. The semiconductor stack according to claim 1, wherein a concentration of Al in the bottom barrier is such that $0.1 \leq x \leq 0.4$.

4. The semiconductor stack according to claim 1, wherein $0.2 \leq v \leq 0.4$.

5. The semiconductor stack according to claim 1, wherein the doping concentration of the n-type material in the doping layer is between $10 \times 10^{11}$ cm$^{-2}$ and $0.8 \times 10^{12}$ cm$^{-2}$.

6. The semiconductor stack according to claim 1, wherein the doping layer has a thickness below 5 nm and above 1 nm.

7. The semiconductor stack according to claim 1, wherein the Al, Ga, As composition of the doping layer is such that for $Al_wGa_{1-w}As$, $0.1 \leq w \leq 0.22$.

8. The semiconductor stack according to claim 1, wherein the thickness of the top barrier is between 40 nm and 2 μm.

9. The semiconductor stack claim 1, wherein the Al, Ga, As composition of the top barrier is such that for $Al_tGa_{1-t}As$, $0.1 \leq t \leq 0.3$.

10. The semiconductor stack according to claim 1, wherein the bottom barrier has a thickness between 40 nm and 500 nm.

11. The semiconductor stack according to claim 1, where an n-doped cap layer is present on the top barrier.

12. The semiconductor stack according to claim 1, wherein the bottom barrier is present on a substrate or on a buffer layer on the substrate.

13. A Hall effect device comprising a semiconductor stack according to claim 1, wherein ohmic contacts are provided on the top barrier.

\* \* \* \* \*